United States Patent [19]

Horiike

[11] 4,192,706
[45] Mar. 11, 1980

[54] GAS-ETCHING DEVICE

[75] Inventor: Yasuhiro Horiike, Tokyo, Japan

[73] Assignee: Tokyo Shibaura Electric Co., Ltd., Tokyo, Japan

[21] Appl. No.: 933,846

[22] Filed: Aug. 15, 1978

Related U.S. Application Data

[62] Division of Ser. No. 647,448, Jan. 8, 1976, Pat. No. 4,123,663.

[30] Foreign Application Priority Data

Jan. 22, 1975 [JP] Japan ................................. 50-8642
Mar. 25, 1975 [JP] Japan ................................. 50-34994
Mar. 28, 1975 [JP] Japan ................................. 50-36851

[51] Int. Cl.² ...................... H01L 21/302; B44C 1/22; B01K 1/00
[52] U.S. Cl. ........................................ 156/643; 156/646; 204/164
[58] Field of Search ............... 156/643, 646; 204/164; 250/527

[56] References Cited

U.S. PATENT DOCUMENTS

| | | | |
|---|---|---|---|
| 3,775,621 | 11/1973 | Gorin | 250/531 |
| 3,867,216 | 2/1975 | Jacob | 156/643 |
| 3,923,568 | 12/1975 | Bersin | 156/643 |
| 4,028,155 | 6/1977 | Jacob | 156/643 |

*Primary Examiner*—F. C. Edmundson
*Attorney, Agent, or Firm*—Finnegan, Henderson, Farabow, Garrett & Dunner

[57] ABSTRACT

A gas etching device comprises a vacuum vessel provided with a means for supplying into the vacuum vessel a gas containing therein oxygen atoms and a gas containing therein fluorine atoms, an etching gas-producing region provided within the vacuum vessel and provided with an exciting means for exciting said gases, and a reaction region provided within the vacuum vessel and disposed at a position spaced apart from the etching gas-producing region and having disposed therein a material to be etched. By the use of this device, etching can be performed with no deterioration of a resist, accordingly with success in fine fabrication, and with no damages to the material to be etched. Further, during the etching, the condition of the etching process can be watched with the naked eyes under illumination of natural light.

14 Claims, 21 Drawing Figures

GAS-ETCHING DEVICE

This is a division of application Ser. No. 647,448, filed Jan. 8, 1976, now U.S. Pat. No. 4,123,663.

BACKGROUND OF THE INVENTION

This invention relates to a gas etching device, and more particularly to a gas etching device wherein etching is conducted using an etching gas produced by exiting and dissociating a gas containing therein oxygen atoms and a gas containing therein fluorine atoms.

Conventionally, where, in the process of manufacturing semiconductor such as, for example, IC, a polycrystalline silicon film, silicon nitride film, silicon dioxide film, molybdenum film, or tungsten film must be finely worked or fabricated, this fine fabrication has been carried out by wet-chemical etching. In recent years, however, an etching technique using the plasma of a gas consisting mainly of, for example, $CF_4$ has been widely accepted in replacement of the wet-chemical etching.

The apparatus disclosed, for example, in U.S. Pat. No. 3,616,461 is known as an apparatus for conducting such plasma etching. This apparatus comprises a vacuum vessel provided exteriorly with a high frequency coil and a material-placing section provided within said vacuum vessel. In this apparatus, by introducing a Freon gas into the vessel and applying a high frequency power having a radio frequency of 13.56 MHz to the high frequency coil, said Freon gas is dissociated by discharge to form a plasma of the Freon gas, and the material is etched using this plasma. In this apparatus, the condition in which etching proceeds is watched under illumination of a visible light containing therein ultraviolet rays which is emitted from the plasma itself.

Further, a condenser type apparatus is also publicly known wherein the Freon gas is dissociated using, instead of the high frequency coil, two electrode plates each having a curved plane.

The etching technique using such apparatus has the following merits as compared with the conventional wet-chemical etching.

(1) Etching of poly-crystalline silicon and silicon nitride can be performed by using a photoresist itself as a mask.
(2) Accordingly, the number of manufacturing process can be decreased.
(3) Harmful effects or nuisances due to chemicals such as, for example, hydrofluoric acid are not produced, which improves the operational environment.

However, what can be said commonly to the above-mentioned known apparatuses is that an etching gas-producing region and a section for placing therein a material to be etched are provided in the same place. For this reason, said known apparatuses pose the following problems.

(1) Due to the radiant heat of the plasma and the actions of exciting light (especially, ultraviolet rays), fluorine ion, etc. a photoresist used as a mask is deteriorated and etched.
(2) Due to oxygen added to a $CF_4$ gas to an extent of 2 to 4% in order to increase the etching rate, the photoresist ashing proceeds.
(3) Due to the changed particles in the plasma the semiconductor element is damaged.
(4) Due to the actions of electric and magnetic fields positive and negative fluorine ions are ununiformly distributed, which causes the etching material or sample to be ununiformly etched.
(5) During the watching of the etching condition, an undesirable effect of said ultraviolet rays upon the naked eyes is produced.

SUMMARY OF THE INVENTION

This invention has been achieved to solve the above-mentioned problems, and is mainly intended to provide a gas etching device which enables etching to be performed with no deterioration of a resist, accordingly with success in fine patterning, and with no electrical damages to a material to be etched, and further enables etching to be carried out while the etching condition is being watched with the naked eyes under illumination of natural light, and is easy to design.

A characterizing feature of the invention resides in that the gas etching device comprises a vacuum vessel provided with a means for supplying into the vacuum vessel a gas containing therein oxygen atoms and a gas containing therein fluorine atoms, an etching gas-producing region provided within the vacuum vessel and provided with an exciting means for exciting said gases, and a reaction region provided within the vacuum vessel and disposed at a position spaced apart from the etching gas-producing region and having disposed therein a material to be etched.

Another characterizing feature of the invention resides in that in the gas etching device the amount of the gas containing therein oxygen atoms is set at at least 10% (by volume) of the amount of the gas containing therein fluorine atoms.

A still another characterizing feature of the invention resides in that in the gas etching device a means for cooling the etching gas-producing region is provided.

A further characterizing feature of the invention resides in that in the gas etching device a means for heating the material to be etched is provided.

A still further characterizing feature of the invention resides in that in the gas etching device a supplementarily exciting means is provided.

DETAILED DESCRIPTION OF THE INVENTION

Figure 1:
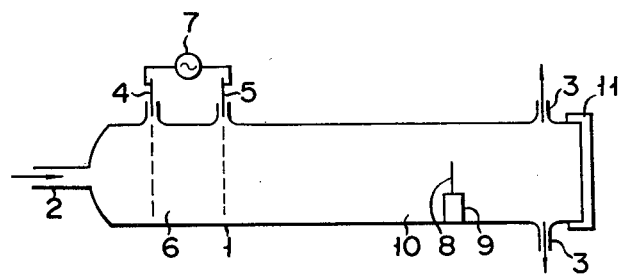
FIG. 1 is a sectional view of a gas etching device according to an embodiment of the invention.

This invention is based on the discovery that when a gas plasma is produced by introducing a Freon gas and an oxygen gas into a vacuum vessel and applying a high frequency power to a pair of flat plate type electrodes disposed within the vacuum vessel and discharging these electrodes, active species or an etching gas having a very long life of several or more seconds is produced and, due to said active species, a poly-crystalline silicon poly-Si, etc. is sufficiently etched even in the place, considerably distant from the plasma, where no exciting light exists. Conventionally, it is generally thought that under a degree of vacuum at which a gas plasma is produced the mean free path of a gas is on the order of a few hundred milimeter at most; and the excited gas atoms and molecules respectively collide with each other to be returned to their ground states. In the conventional plasma-etching device wherein the Freon gas is dissociated by discharge through applying an RF (radio frequency) to the high frequency coil or condenser type electrode which is disposed outside the vacuum vessel, therefore, a material such as poly-Si was not etched in a leeward place at a distance of ten centimeters odd from the etching gas-producing region. It has been found, however, that when, as in the device of the invention, the Freon gas is dissociated and excited by discharge through providing a pair of flat type electrodes in the vacuum vessel and applying an RF thereto, the poly-Si is etched in a leeward place at a distance of ten centimeters odd from the etching gas-producing region though the etching rate of the poly-Si is as low as about 2 A/min., and that when an oxygen gas equal in volume to the Freon gas is added thereto, the etching rate of the poly-Si in a leeward place at the same distance from the etching gas-producing region is largely increased up to about 1500 A/min.. This is considered because the Freon gas and the oxygen gas are dissociated by applying a high power to the narrow-arranged paired electrodes to form an active species or an etching gas having a very long life.

As previously mentioned, the gas etching device of the invention has solved various problems by isolating the etching gas-producing region from the reaction region. Further, in this device, when the amount of gas containing oxygen atoms is set at at least 10% (by volume) of the amount of gas containing fluorine atoms, the etching rate can be largely increased. Further, a decrease in the etching rate due to a rise in the temperature of the etching gas-producing region can be prevented by cooling the etching gas-producing region. Further, by heating the material to be etched, etching is uniformly achieved and simultaneously the etching rate is increased, so that the time required to carry out the manufacturing process can be shortened. Further, by providing a supplementarily exciting means in the reaction region to bring the reaction region into a condition wherein it is being excited due to weak discharge, the etching rate can be largely increased and even in the case where the distance between the etching gas-producing region and the material to be etched is great, a decay in the etching gas does not occur and therefore the etching gas can be sent into a number of reaction regions and therefore the device becomes easy to design, because the etching gas-producing region and the reaction region can be connected by a pipe which guides the etching gas.

Hereinafter, embodiments of the invention are explained by reference to the appended drawings.

FIG. 1 shows the outline of a gas etching device of the invention. A vacuum vessel 1 is a quartz tube having a diameter of, for example, 60 mm, and provided with a gas inlet 2 and a gas outlet 3. A mixed gas of a gas containing fluorine atoms such as Freon gas ($CF_4$) and a gas containing oxygen atoms such as oxygen gas is introduced into the vessel from said gas inlet 2. As another gas-introducing method, it is possible to introduce only the Freon gas from the gas inlet 2 and dispose in advance a substance evolving the gas containing therein oxygen atoms such as an oxide or quartz glass in the vacuum vessel 1.

The gas outlet 3 is connected to a vacuum pump (not shown), and by this pump the vessel interior is kept at a vacuumized condition of, for example, 0.1 to 1 Torr.

The mixed gas introduced into the vacuum vessel 1 is supplied into an etching gas-producing region 6 formed between a pair of parallel plate electrodes 4 and 5. As the pair of parallel plate electrodes 4 and 5 perpendicularly to the gas-flow direction within the vessel 1, in comparison with the conventional plasma etching device which is provided with coils or electrodes outsides of the vessel, power consumption in this device can be decreased. The parallel plate electrodes 4, 5 are constituted by two parallel circular aluminum plates, the diameter of each of which is 56 mm and which each have a number of apertures each having a diameter of 5 mm, and the distance between which is 12 cm. But the distance between these paired electrodes and the diameter of said apertures do not particularly influence the action and effect of the invention, and it will serve the purpose if only two plate electrodes having a number of apertures as gas-passageways are arranged in parallel. When a power having an RF (radio frequency) of 13.56 MHz is applied between the electrodes 4 and 5, discharge is effected in said mixed gas to produce a plasma composed of positive and negative ions, neutral atoms and molecules, of fluorine and oxygen. It is also possible to use a D.C. high voltage source or a microwave generator instead of the RF power source, which would be able to further increase the etching rate. The use of the microwave generator would offer an advantage that the electrodes disposed within the vacuum vessel become unnecessary.

The etching gas thus produced is then guided to a reaction region 10 spaced apart from the etching gas-producing region 6. Within the reaction region 10, a material to be etched 8 is disposed on a support member 9 at a distance of, for example, 30 cm from the electrode 5. Introduction or withdrawal of the material 8 can be effected by mounting or dismounting a covering 11 provided for the vacuum vessel 1.

Figure 2:
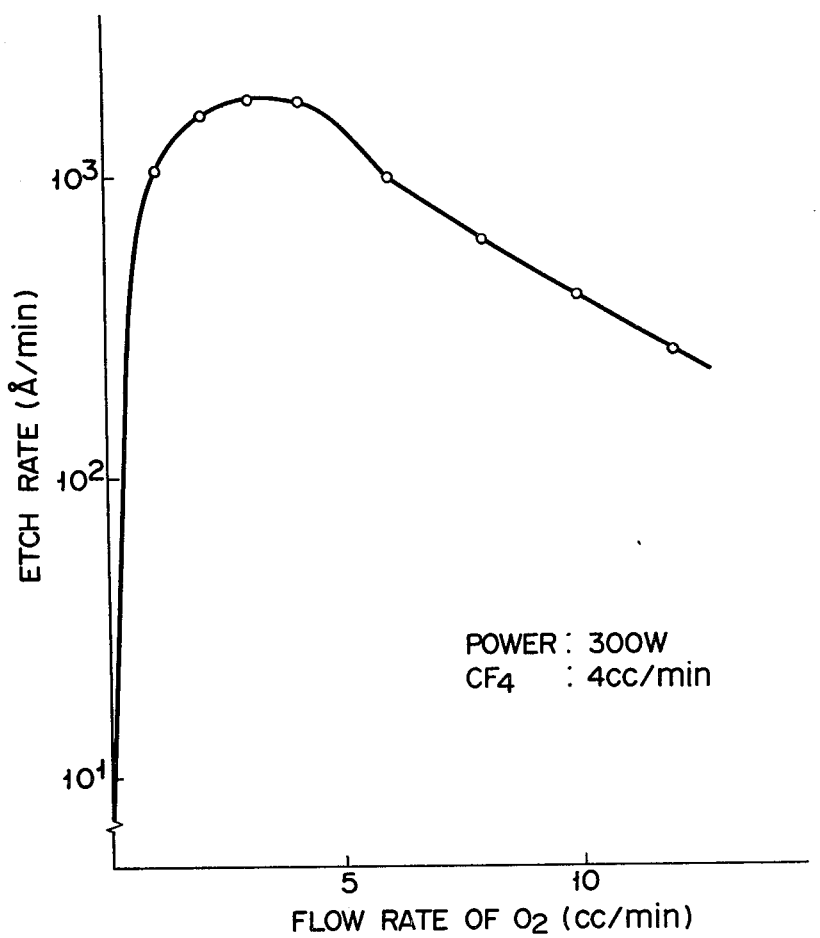
FIG. 2 graphically shows the results obtained by performing etching by the use of the device of FIG. 1.

FIG. 2 graphically shows the results obtained by etching a poly-Si film at a growing temperature of 680° C., undoped using the Freon gas ($CF_4$) and oxygen gas ($O_2$) as an etching gas and employing the above-mentioned gas etching device of the invention. In FIG. 2, the flow rate of $O_2$ (cc/min.) is plotted on the abscissa and the etching rate of the poly-Si film (A/min.) is plotted on the ordinate. At that time, the flow rate of $CF_4$ was 4 cc/min., the RF power was 300 W, and the exhaust rate by the vacuum pump was 300 l/min. According to the conventional method, the ratio of the flow rate of $O_2$ to that of $CF_4$ was made as extremely low as 2 to 4%, but as apparent from FIG. 2, in the case of employing the device of the invention, it is seen that said ratio can be effectively set at a value much greater than said value of 2 to 4%, for example, more than 10%. As a result, since, according to the invention, the adding amount of $O_2$ can be increased, flow rate control becomes extremely easy whereas since, according to the conventional method, the adding amount of $O_2$ is small, it is difficult to control exactly flow rate of $O_2$ and the etching rate.

Further, as apparent from FIG. 2, it is seen that as the introducing amount of $O_2$ is decreased, the etching rate is descreased rapidly. In contrast, when the introducing amount of $O_2$ was increased, a decrease in the etching rate was not sharp though the degree of vacuum was decreased. Further, where the exhaust rate by the vacuum pump was set at 300 l/min., a decrease in the etching rate due to an increase or decrease in the introducing amount of oxygen gas occurred only to a small extent and the larger the exhaust rate, the faster the etching rate, for the amount of the etching gas per minutes produces the more.

Further, with respect to the position of the material to be etched, when it was placed at a distance of not less than 10 cm from the etching gas-producing region, a preferable result was obtained. Further, when the input power was increased, the etching rate was raised.

Hereinafter, various modifications of the gas etching device of the invention are shown.

Figure 3:
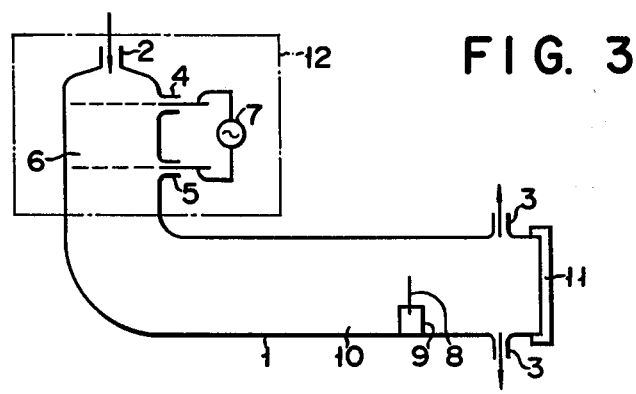
FIG. 3 is a sectional view of the gas etching device according to another embodiment of the invention.

A gas etching device shown in FIG. 3 is of the structure wherein the etching gas-producing region 6 of the device shown in FIG. 1 is bent with respect to the reaction region 10. In this device, the whole of the etching gas-producing region 6 is surrounded by a shielding member 12. By so doing, the ultraviolet rays radiated from the etching gas-producing region 6 are completely shielded with the result that it becomes possible to watch under illumination of natural light the condition in which the material 8 to be etched or sample is being etched and, accordingly, the operation efficiency is remarkably increased.

Figure 4:
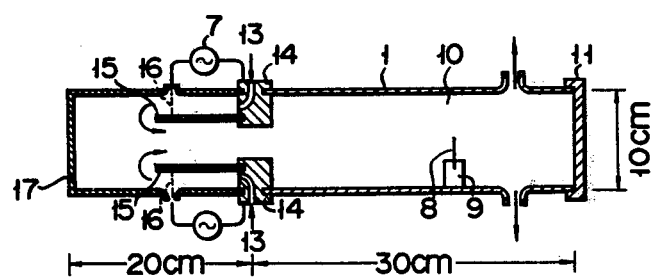
FIG. 4 is a sectional view of the gas etching device according to another embodiment of the invention.

A gas etching device shown in FIG. 4 is of the structure wherein the etching gas-producing region is sufficiently spaced apart from the reaction region, and, by being so constructed, capable of achieving a much better etching. A tube 14 each having a gas inlet 13 formed therein are attached to the vacuum vessel 1 formed of, for example, a quartz tube. The tube 14 are each made of aluminum and concurrently act as a pair of electrodes and are so provided as to seal the vacuum vessel 1 and further are fitted with cylindrical alumina tubes 15 each having a length of about 10 cm. The gas introduced from the gas inlet 13 (for example, a mixed gas of $CF_4$ and $O_2$) is passed through regions each defined by the outer wall of the alumina tube 15 and the inner wall of the vacuum vessel. The electrodes made by a doughnut-like perforated aluminum plate 16 are provided in the neighbourhoods of the exits of these regions. An RF power 7 is applied between the electrodes and a corresponding the tube. As a result, said mixed gas is dissociated to produce an etching gas. Arrows of FIG. 4 indicate the flow direction of the etching gas. The covering 11 is made of quartz. Further, the outer wall 17 of the etching gas-producing region is made of alumina, and plays the role of preventing the quartz from being corroded due to the action of the etching gas.

Figure 5:
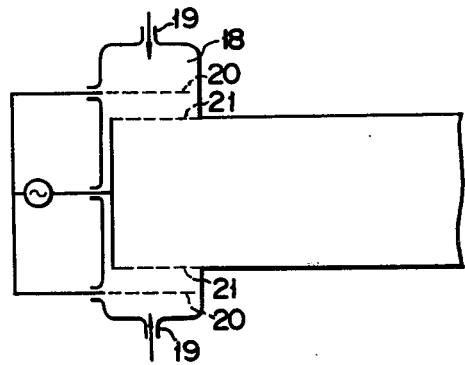
FIG. 5 is a sectional view showing a modification of an etching gas-producing region of the gas etching device of the invention.

FIG. 5 shows a modified structure of the etching gas-producing region. The mixed gas of Freon gas and oxygen gas is introduced from a gas inlet 19 formed in a peripheral portion of a disc plate-like etching gas-producing region 18 into this region 18. Within the etching gas-producing region 18 two pairs of perforated aluminum electrodes 20, 21 each having a number of apertures are concentrically provided in an insulated and sealed manner. An RF power is applied between these electrodes to produce an etching gas.

Figure 6:
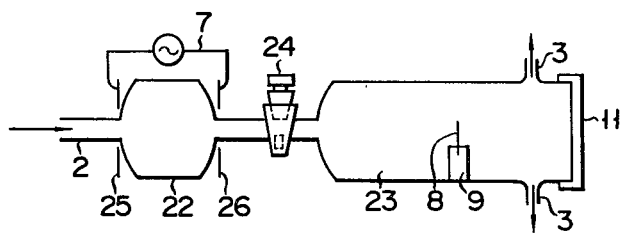
FIG. 6 is a sectional view of the gas etching device of the invention wherein a cock is provided between the etching gas-producing region and the reaction region.

A gas etching device shown in FIG. 6 is of the structure wherein a cock 24 is provided between an etching gas-producing region 22 constituting the vacuum vessel and a reaction region 23. The cock 24 is for the purpose of adjusting the degree of vacuum of the etching gas-producing region 22. A pair of electrodes 25, 26 are provided outside the etching gas-producing region 22, and an RF power is applied between these electrodes. The mixed gas of Freon gas and oxygen gas introduced from the gas inlet 2 into the etching gas-producing region 22 is excited by application of an RF power to produce an etching gas. This etching gas is passed through a gas outlet of the etching gas-producing region and the cock 24 and is supplied from a gas inlet of the reaction region 23 into the region 23 and due to the action of this etching gas the sample 8 is etched. Where the cock 24 is closed, the etching gas is confined in the etching gas-producing region 22, and etching can be performed by opening the cock 24 as required. Further, the plasma-producing requirements and etching reaction conditions can be made optimum by adjusting the degree of vacuum in which the cock 24 is regulated.

Figure 7:
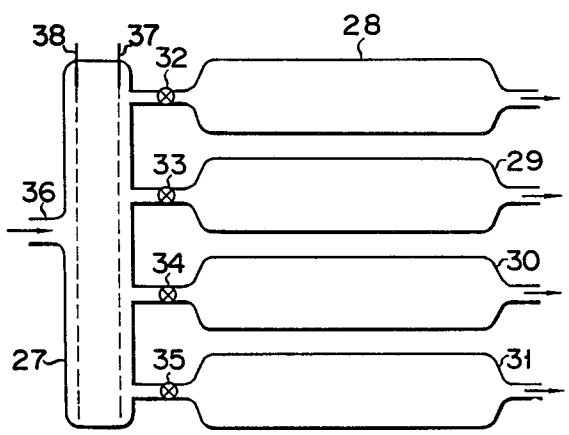
FIG. 7 is a sectional view of the gas etching device of the invention having a number of reaction regions.

FIG. 7 shows a gas etching device of the structure wherein the vacuum vessel is composed of an etching gas-producing region 27 and a plurality of reaction regions 28, 29, 30, and 31. Valves 32, 33, 34 and 35 are provided between the etching gas-producing region 29 and reaction regions 28, 29, 30 and 31. Through opening or closing these valves, the reaction regions can be opened or closed, and adjusted in terms of pressure. The mixed gas of Freon gas and oxygen gas introduced from a gas inlet 36 into the etching gas-producing region 27 is excited by applying an RF power between a pair of electrodes 37, 38 provided within the etching gas-producing region 27, to produce an etching gas. This etching gas is passed through the valves 32, 33, 34 and 35 to enter the reaction regions 28, 29, 30 and 31, and thus the material is etched. By maintaining the valve to be closed and then recovering the atmospheric pressure in the reaction regions, the materials in the regions can be individually replaced for each reaction region.

Figure 8:
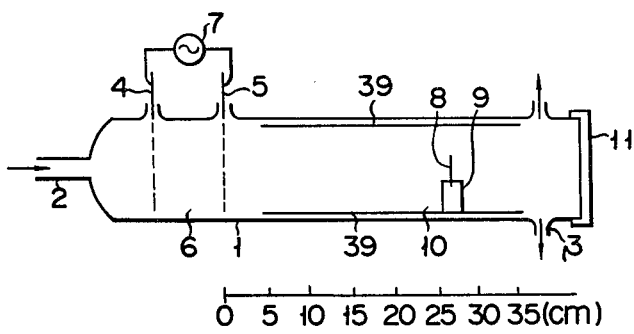
FIG. 8 is a sectional view of the gas etching device of the invention whose reaction region has an aluminum-made cylinder.
Figure 9:
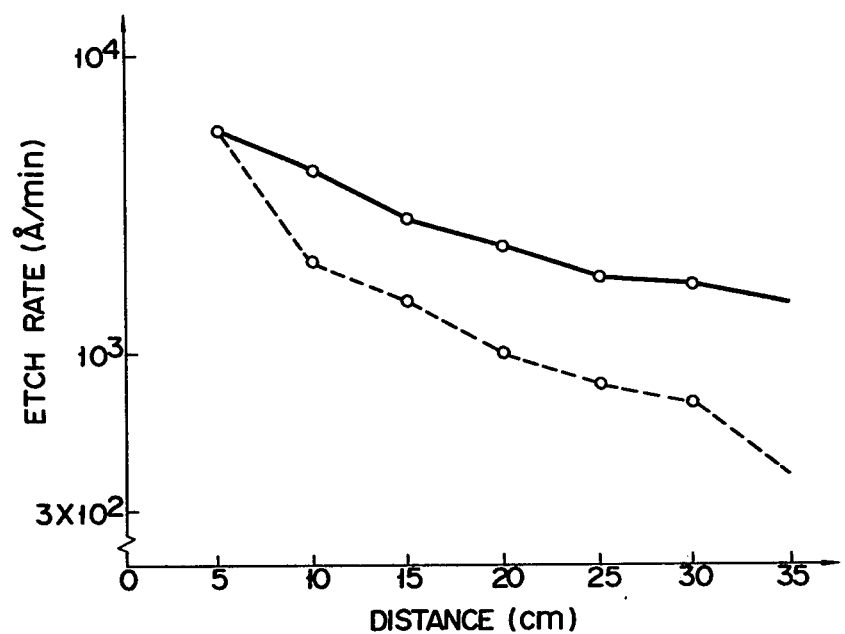
FIG. 9 graphically shows the results obtained by performing etching by the use of the device of FIG. 8.

FIG. 8 shows a gas etching device of the structure wherein an aluminum-made cylinder 39 is inserted into the reaction region 10 of the gas etching device shown in FIG. 1. In this device, the etching rate was increased up to twice or more the etching rate attainable where said cylinder 39 is not inserted. As an example, the results obtained by etching a poly-Si using this device and that device with no such cylinder which is shown in FIG. 1 is presented in FIG. 9. On the ordinate the etching rate is plotted and on the abscissa the distance between the electrode 5 and the material 8 is plotted. Etching was carried out under the condition wherein the input power is 300 W; the flow rate of $CF_4$ is 4 cc/min.; and the flow rate of $O_2$ is 4 cc/min.. In FIG. 9, the case where etching is performed using the device with said cylinder is indicated by a solid line and the case where etching is performed using the device with no such cylinder by a broken line. As apparent from FIG. 9, the etching rate is remarkably increased by disposing the aluminum-made cylinder in the reaction region.

Figure 10:
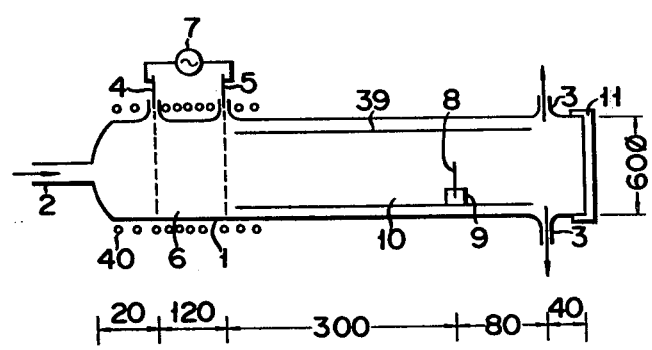
FIG. 10 is a sectional view of the gas etching device of the invention whose etching gas-producing region is provided therearound with cooling pipes.
Figure 11:
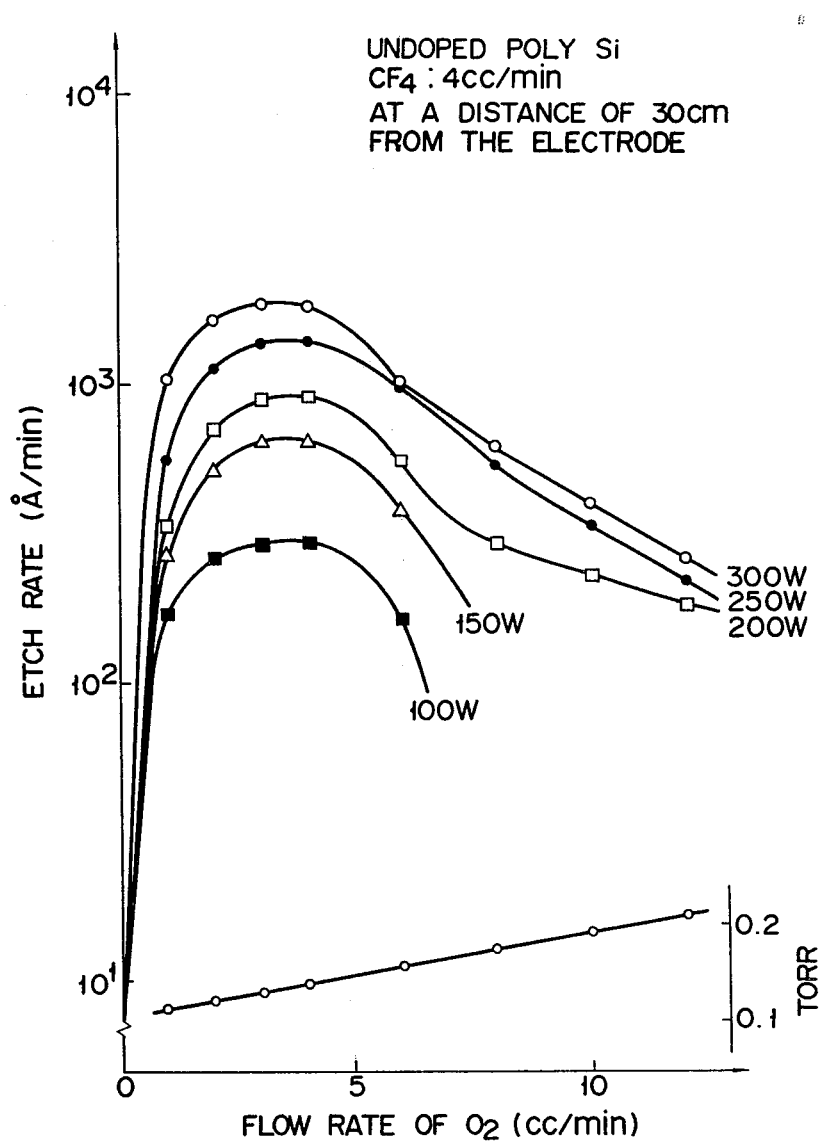
FIG. 11 graphically shows the results obtained by performing etching with the power varied, by the use of the device of FIG. 10.

FIG. 10 shows a gas etching device of the structure wherein a cooling means such as cooling pipes is provided outside the etching gas-producing region 6 of the gas etching device shown in FIG. 8. FIG. 11 graphically shows the etching rate when a poly-Si is etched using this device; and the flow rate of $O_2$ is varied under the condition wherein the flow rate of $CF_4$ is set to 4 cc/min.. This graphic diagram shows also the relationship between the flow rate of $O_2$ and the etching rate, established when the power is varied. From FIG. 11 it is seen that even when a plasma is produced with a low power of 100 W or 150 W, a high etching rate is obtained with a mixing rates of $CF_4$ to $O_2$, of about 4:1 to 6, that is, a sufficiently large amount of etching gas is produced. Further, it is also seen that as the applied power is increased, the maximum etching rate is shifted in a direction in which the flow rate of $O_2$ is increased, and simultaneously that a high etching rate is obtained over a wide range of flow rate of $O_2$. That is, when a large amount of power is applied, the amount of $O_2$ can be chosen over a wide range. For this reason, even when the flow rate of $O_2$ is on the order of 0.5 cc/min. based on a $CF_4$ flow rate of 4 cc/min., that is, if only the amount of $O_2$ in the mixed gas is about 10% or more of the amount of $CF_4$, an etching gas is easily produced. Further, in FIG. 11, the variation in the vacuum degree is also shown, and it is also seen that the range of this variation is as very narrow as 0.1 to 0.2 Torr.

The reasons why, in the gas etching device shown in FIG. 10, the cooling pipes 40 are provided outside the etching gas-producing region 6 are as follows. As the period of time during which the etching operation is carried out becomes long, the temperature of the etching gas-producing region is increased as a matter of course. Generally in the plasma etching device, as the temperature rising, the etching rate of silicon dioxide ($SiO_2$) become high.

Figure 12:
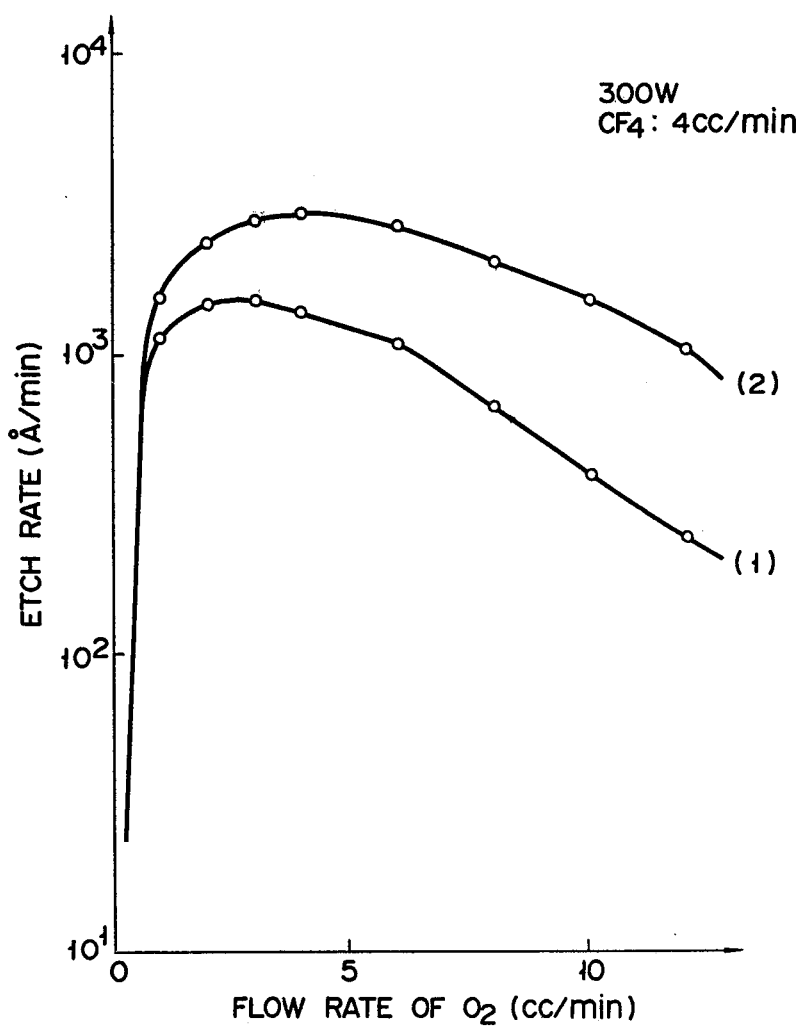
FIG. 12 graphically shows, while comparing, the results obtained by performing etching by the use of the device of FIG. 10 and a similar device with no cooling pipes.

As the etching gas produced is consumed to etch the wall of the quartz tube, the etching rate of materials to be etched decreases. Accordingly, that temperature rise is prevented by cooling the wall of the etching gas-producing region by the cooling pipes 40. This cooling effect is shown in FIG. 12. FIG. 12 graphically shows the etching rate of a poly-Si obtained when cooling is not performed (1) and when cooling is performed (2). From this graphical diagram it is seen that the etching rate is made two-fold by cooling the etching gas-producing region.

Figure 13:
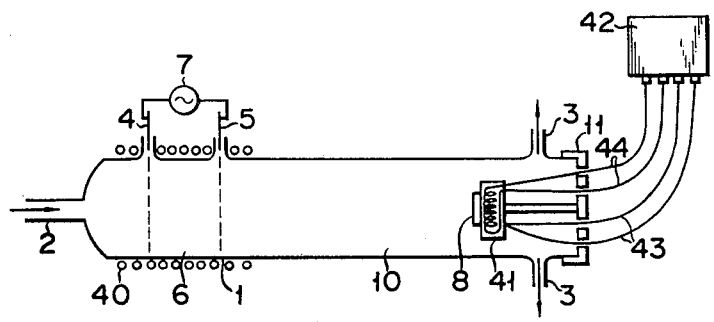
FIG. 13 is a sectional view of the gas etching device of the invention provided with a heating plate for heating the material to be etched.
Figure 14:
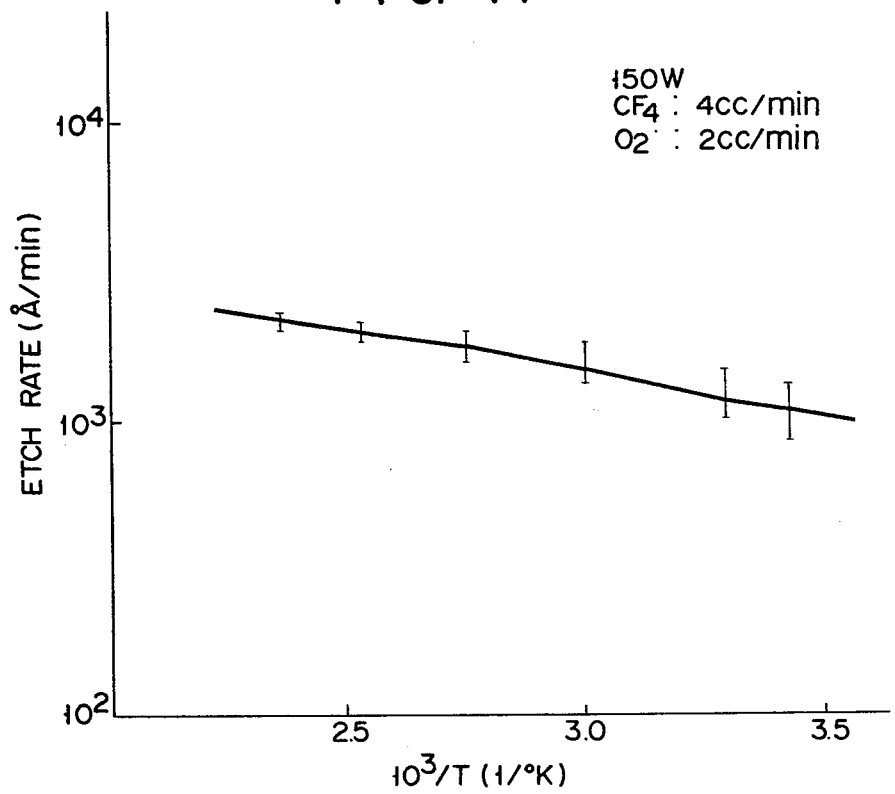
FIG. 14 graphically shows the results obtained by performing etching by the use of the device of FIG. 13.

FIG. 13 shows a gas etching device of the structure wherein a heating means for heating the material 8 to be etched such as a heating plate 41 is provided within the reaction region 10. The temperature of the material 8 is controlled from outside by a controller 42, 43 denotes thermocouples and 44 wiring for said heating means. FIG. 14 graphically shows the etching rate when, in the case of etching a poly-Si using the gas etching device shown in FIG. 13, the temperature of the material 8 is varied utilizing the heating plate 41. In FIG. 14, $1/T \times 10^3$ (where T is absolute temperature) is plotted on the abscissa, and the vertical lines each represent the degree of uniformity in the etching rate. From this graphic diagram it is seen that as the material temperature is increased, the length of the vertical lines representing the degree of uniformity in the etching is remarkably decreased, that is, the uniformity degree in the etching becomes smaller.

Figure 15:
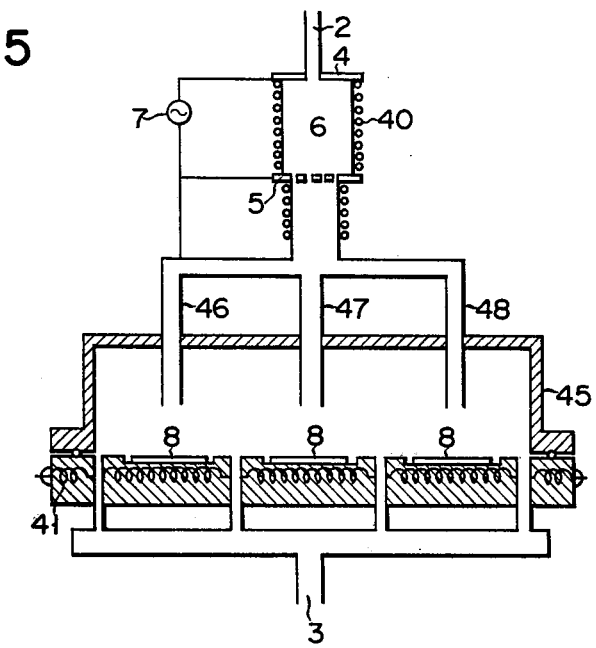
FIG. 15 is a sectional view of a vertical type gas etching device of the invention.
Figure 16:
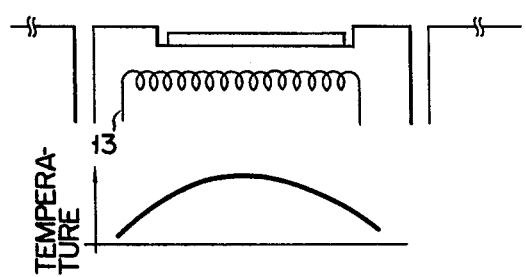
FIG. 16 graphically shows the distribution of the temperature of the material-placing section of the device of FIG. 15.

FIG. 15 shows a gas etching device for batch-processing a large number of silicon wafers. Any of the above-mentioned gas etching devices is of the horizontal type. When materials are etched in any of the above-mentioned gas etching device, the materials to be etched is set at parallely toward a gas flow. In this type of gas etching device, the etching gas is first consumed from the windward side of the material to be etched and then etching proceeds toward the leeward side, and therefore, when the etching operation is completed, a portion of the material 8 at the windward side is etched superfluously. In order to eliminate such drawback, the device shown in FIG. 15 is constructed into a vertical type. In this device, the etching gas is supplied to the material through gas-introducing pipes 46, 47 and 48 constituting the inlet portions of a reaction region 45. Further, in this device, the etching gas-producing region is cooled and the material to be etched is heated, similarly to the device shown in FIG. 13. As a result, etching was uniformly achieved at a high etching rate. Further, in this device, etching is likely to be performed from the peripheral portion toward the central portion, of the material to be etched. Therefore, by constructing the heater so that each support member is more heated at its central portion than at its peripheral portion, etching can be conducted more uniformly.

Next, a gas etching device of the type wherein, in the aforesaid gas etching devices of the invention, a supplementarily exciting means is provided within their reaction region is described.

Figure 17:
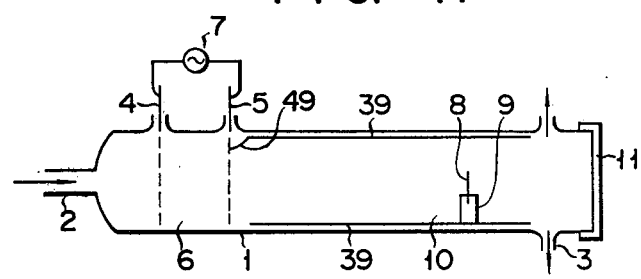
FIG. 17 is a sectional view of the gas etching device of the invention wherein the aluminum cylinder within the reaction region is connected to one of two electrode plates in the etching gas-producing region.
Figure 18:
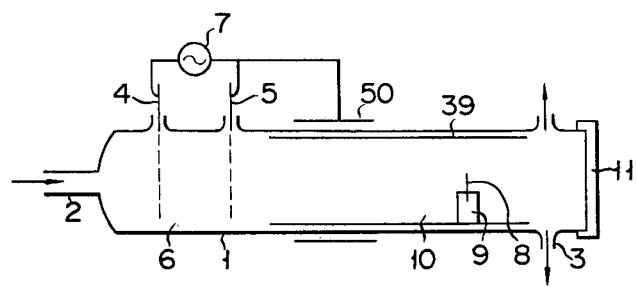
FIG. 18 is a sectional view of the gas etching device of the invention wherein a cylindrical electrode is provided outside the reaction region and part of the high frequency is applied to this electrode.
Figure 19:
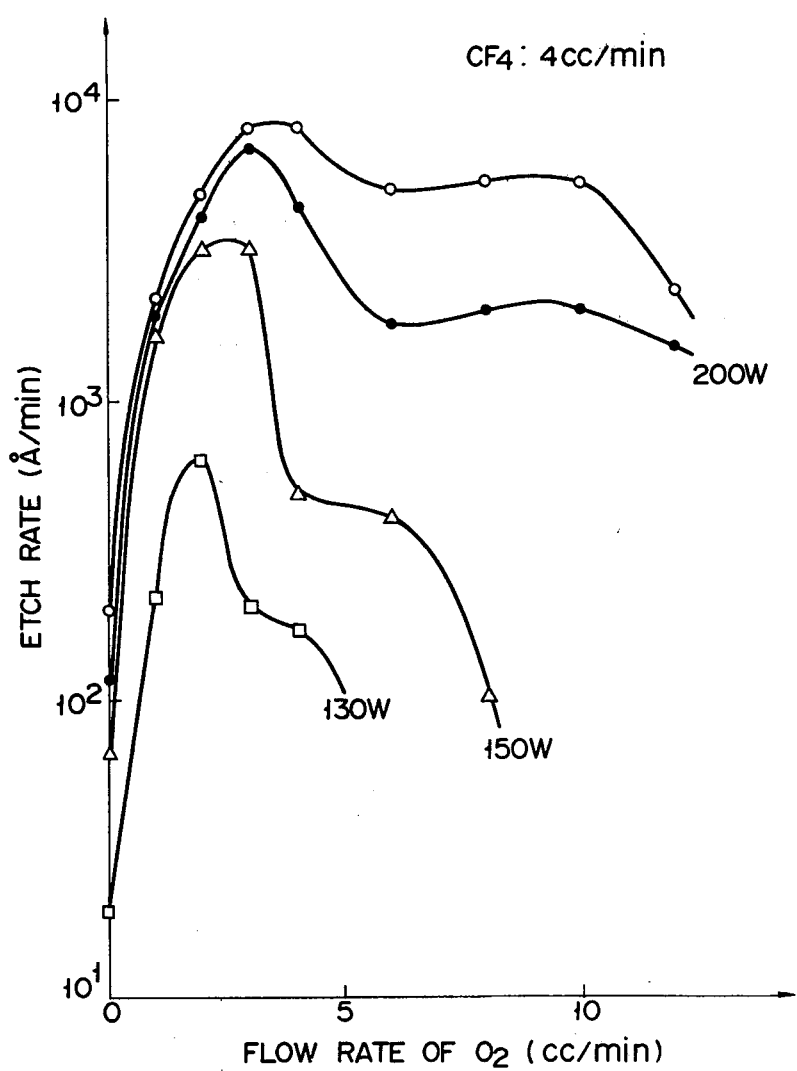
FIG. 19 graphically shows the results obtained by performing etching by the use of the device of FIG. 18.

FIG. 17 shows a gas etching device of the structure wherein, in the gas etching device shown in FIG. 8, an aluminum-made cylinder 39 inserted into its reaction region 10 is connected by a conductor 49 to one of the pair of electrodes of the etching gas-producing region. Since, in this type of device, the reaction region interior is kept in a state excited due to weak discharge, the etching gas is not decayed. Therefore, when etching was carried out using this device, there was obtained an etching rate which is as extremely high as four times the etching rate obtained in the case of using a conventional device as shown in FIG. 19. Even a tungsten silicide, for example, which was conventionally difficult to etch has become possible with this device. Further, it has become possible with this device to perform etching without deteriorating a photoresist due to, for example, ultraviolet rays as in the conventional case. A gas etching device shown in FIG. 18 is of the structure wherein a cylindrical electrode 50 is provided outside the reaction region 10 and, by applying part of high frequency to this electrode, the aluminum-made cylinder 39 within the reaction region 10 is high frequency-coupled to that electrode 50. Also in the case where etching was performed using said device, such results as shown in FIG. 19 were obtained.

Figure 20:
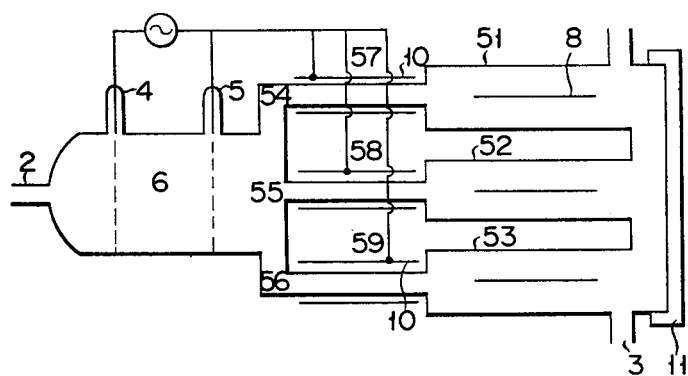
FIG. 20 is a sectional view of the gas etching device of the invention for etching a number of materials to be etched, wherein electrodes connected to a high frequency source are provided outside pipes for guiding an etching gas from the etching gas-producing region to the material to be etched.

Such supplementarily exciting means provided for the reaction region is effective particularly when the distance between the etching gas-producing region and the material to be etched is large as in the following example. A gas etching device shown in FIG. 20 is at the structure wherein a number of reaction regions are so provided as to etch a number of materials to be etched. Since, in this type of device, the distance over which the etching gas is supplied to the materials is large, the etching gas is decayed to cause a decrease in the etching rate. In order to prevent the decay of the etching gas, aluminum-made cylinder electrodes 57, 58 and 59 are provided outside those guide pipes 54, 55 and 56 constituting the respective inlet portions of the reaction regions 51, 52 and 53 which are intended to guide the etching gas to the material to be etched from the etching gas-producing region and are connected to a high frequency power source of the etching gas-producing region thereby to bring the interiors of said guide pipes 54, 55 and 56 to a state excited due to weak discharge. Thus, even when the etching gas is passed through a passageway having a sufficiently large length, it is not decayed and as a result the etching rate can be maintained high. Further, by providing a supplementarily exciting means similar to said aluminum-made cylinder electrodes for the etching gas-introducing pipes 46, 47 and 48 of the vertical type gas etching device shown in FIG. 15, a number of materials can be well etched.

Figure 21:
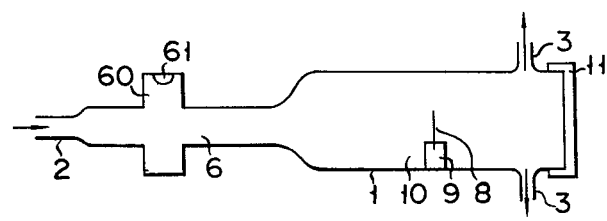
FIG. 21 is a sectional view of the gas etching device of the invention provided with a microwave generating means as an exciting means.

The foregoing description referred to the gas etching device so designed as to produce an etching gas by exciting $O_2$ and $CF_4$ through applying a high frequency. But it is also possible to produce an etching gas by exciting those gases through applying a microwave (e.g. 2.4 GHz). In this case, a further increasing amount of etching gas is produced and therefore the etching gas can be carried farther. In a gas etching device shown in FIG. 21, the etching gas-producing region 6 has only to be designed to penetrate through a rectangular wave guide 60, which offers an advantage that the paired electrodes within the vacuum vessel are unnecessary. The mixed gas introduced is excited by a microwave generated from a microwave generator 61 provided for the wave guide 60 thus to become an etching gas. The reason why the inner diameter of the etching gas-producing region 6 is made smaller than that of the reaction region 10 is that since, in FIG. 21, the use of an S band frequency (2 to 4 GHz) is pressupposed, the region 6 can not but become smaller in diameter as a matter of course, as compared with the region 10 within which a material to be etched having a diameter of 50 to 70 mm is set. If, therefore, an L band frequency (1 to 2 GHz) is used, an etching gas-producing region having a larger diameter can be used.

What is claimed is:

1. A gas etching process comprising:
    introducing into a discharge region an oxygen gas and a flurocarbon gas,
    producing a long life active species etching gas by applying high frequency power to said gases in the discharge region, and
    reacting said etching gas with the material to be etched in a reaction region spaced from the discharge region a distance such that electric fields in the discharge region do not extend to the reaction region.

2. A gas etching process according to claim 1 wherein the amount of said oxygen gas is at least 10% by volume of the amount of said flurocarbon gas.

3. A plasma-free gas etching process for etching a material comprising:
    introducing gas into an etching gas-producing region,
    activating the gas with a high frequency discharging device thereby forming a long-life active species as the etching gas, and
    withdrawing the etching gas from the etching gas-producing region into a connecting reaction region spaced from the etching gas-producing region a fixed distance providing electrical isolation from electric fields in the etching gas-producing region, thereby causing the etching gas to remain sufficiently activated to etch the material in the reaction region but to be plasma-free.

4. A plasma-free gas etching process for etching a material according to claim 3 further comprising:
    positioning the high frequency discharging device outside the etching gas-producing region, and
    controlling the rate of flow of the etching gas from the etching gas-producing region into the reaction region.

5. A plasma-free gas etching process for etching a material according to claim 4 further comprising:
    cooling the etching gas-producing region.

6. A plasma-free gas etching process for etching a material according to claim 3 further comprising:
    interposing a bended portion in the space between the etching gas-producing region and the connecting reaction region.

7. A plasma-free gas etching process for etching a material according to claim 6 further comprising:
    defining a substantially right-angle bend with the bended portion.

8. A plasma-free gas etching process for etching a material according to claim 3 further comprising:
    supporting the material etched in the reaction region such that the etching gas flows perpendicularly to the plane of its surface.

9. A plasma-free gas etching process for etching a material according to claim 3 further comprising:
    disposing a pair of apertured electrodes connected to a high frequency power source perpendicularly to the flow of the gases in the etching gas-producing region as the high frequency discharging device.

10. A plasma-free gas etching process for etching a material accoring to claim 3 further comprising:
cooling the etching gas-producing region.

11. A plasma-free gas etching process for etching a material according to claim 3 further comprising:
mixing an oxygen gas and freon gas, the amount of the oxygen gas being at least 10% by volume of the amount of the freon gas, for activation as the etching gas.

12. A plasma-free gas etching process for etching a material according to claim 3 further comprising:
branching the etching gas to selected locations in the reaction region.

13. A plasma-free gas etching process for etching a material according to claim 3 further comprising:
branching the etching gas to a plurality of reaction regions.

14. A gas etching process according to claim 1 wherein the flurocarbon gas is $CR_4$.

* * * * *

UNITED STATES PATENT AND TRADEMARK OFFICE
CERTIFICATE OF CORRECTION

PATENT NO. : 4,192,706

DATED : March 11, 1980

INVENTOR(S) : Yasuhiro Horiike

It is certified that error appears in the above-identified patent and that said Letters Patent are hereby corrected as shown below:

Column 12, line 10, change "$CR_4$" to --$CF_4$--.

Signed and Sealed this

Fifth Day of August 1980

[SEAL]

Attest:

SIDNEY A. DIAMOND

Attesting Officer — Commissioner of Patents and Trademarks